United States Patent [19]

Yu

[11] Patent Number: 5,300,935
[45] Date of Patent: Apr. 5, 1994

[54] ANTENNA CONTROLLING APPARATUS AND METHOD THEREOF

[75] Inventor: Jae-cheon Yu, Seoul, Rep. of Korea

[73] Assignee: SamSung Electronics Co., Ltd., Kyungki, Rep. of Korea

[21] Appl. No.: 997,203

[22] Filed: Dec. 28, 1992

[30] Foreign Application Priority Data

Dec. 26, 1991 [KR] Rep. of Korea .................. 91-24490
Dec. 30, 1991 [KR] Rep. of Korea .................. 91-25464

[51] Int. Cl.$^5$ ............................................. H01Q 3/00
[52] U.S. Cl. ................................... 342/359; 348/731
[58] Field of Search ............... 342/359; 358/191.1, 358/193.1

[56] References Cited

U.S. PATENT DOCUMENTS 4,521,913  6/1985  Huber et al. .
4,743,909  5/1988  Nakamura et al. .
4,796,032  1/1989  Sakurai et al. .................. 342/359

OTHER PUBLICATIONS

Abstract of Japanese Patent Laid-Open No. Sho 63-18703.
Abstract of Japanese Patent Laid-Open No. Hei 1-129510.

Primary Examiner—Theodore M. Blum
Attorney, Agent, or Firm—Sughrue, Mion, Zinn, Macpeak & Seas

[57] ABSTRACT

An antenna controlling apparatus for automatically fine tuning the broadcast signal received via an antenna to precisely tune a desired channel at a tuner including an antenna driving unit for controlling the direction of an antenna to be in the optimum condition for receiving radio waves according to the radio-wave receiving condition transmitted via the antenna, a sensor for detecting the variation of the antenna as the direction of the antenna changes by the antenna driving unit, a memory for storing direction information of the antenna detected by the sensor when the direction of the antenna is in the optimum condition for receiving radio waves, and a microcomputer for reading out for a given channel the position information of the antenna corresponding to the optimum condition for the channel.

5 Claims, 7 Drawing Sheets

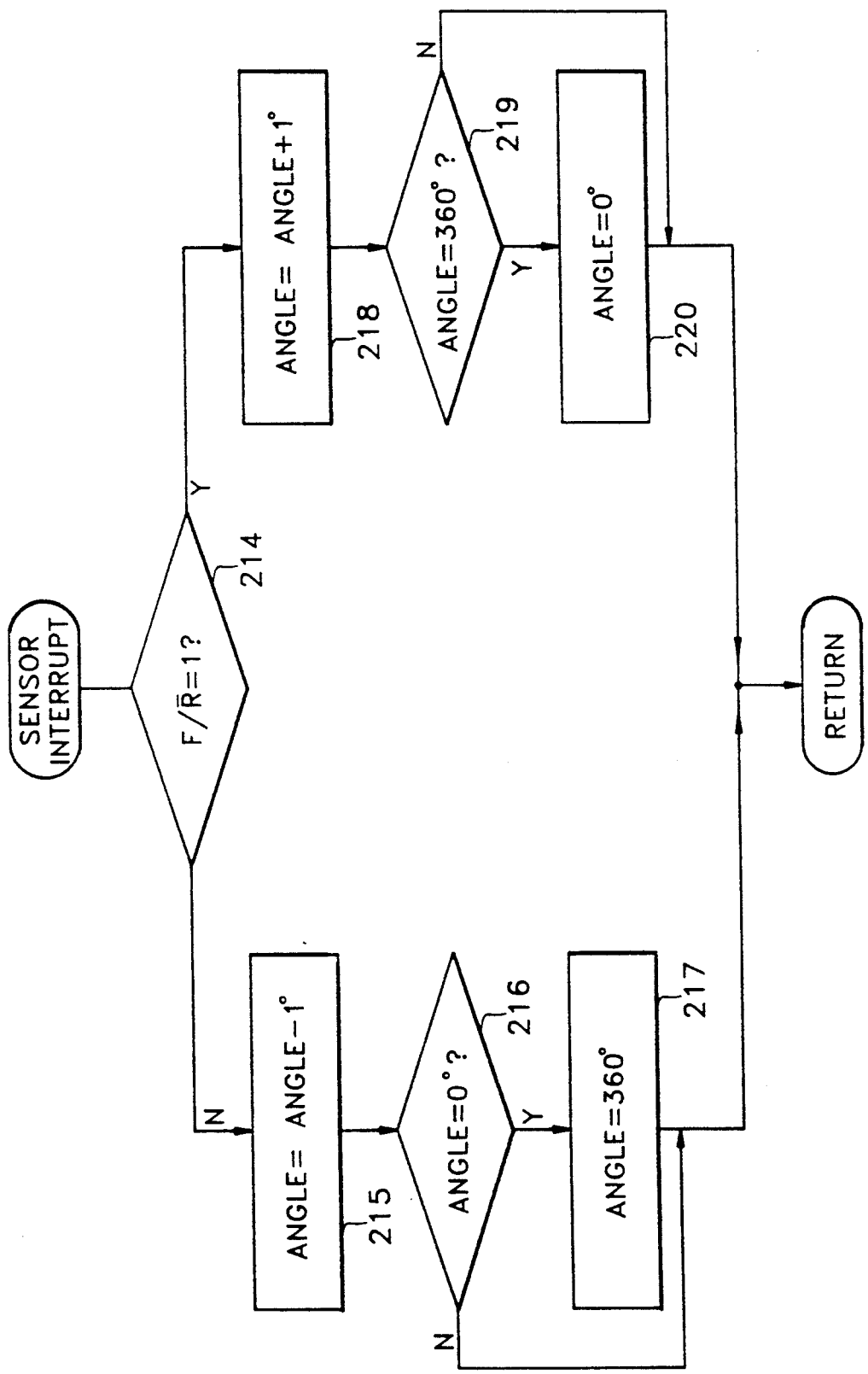

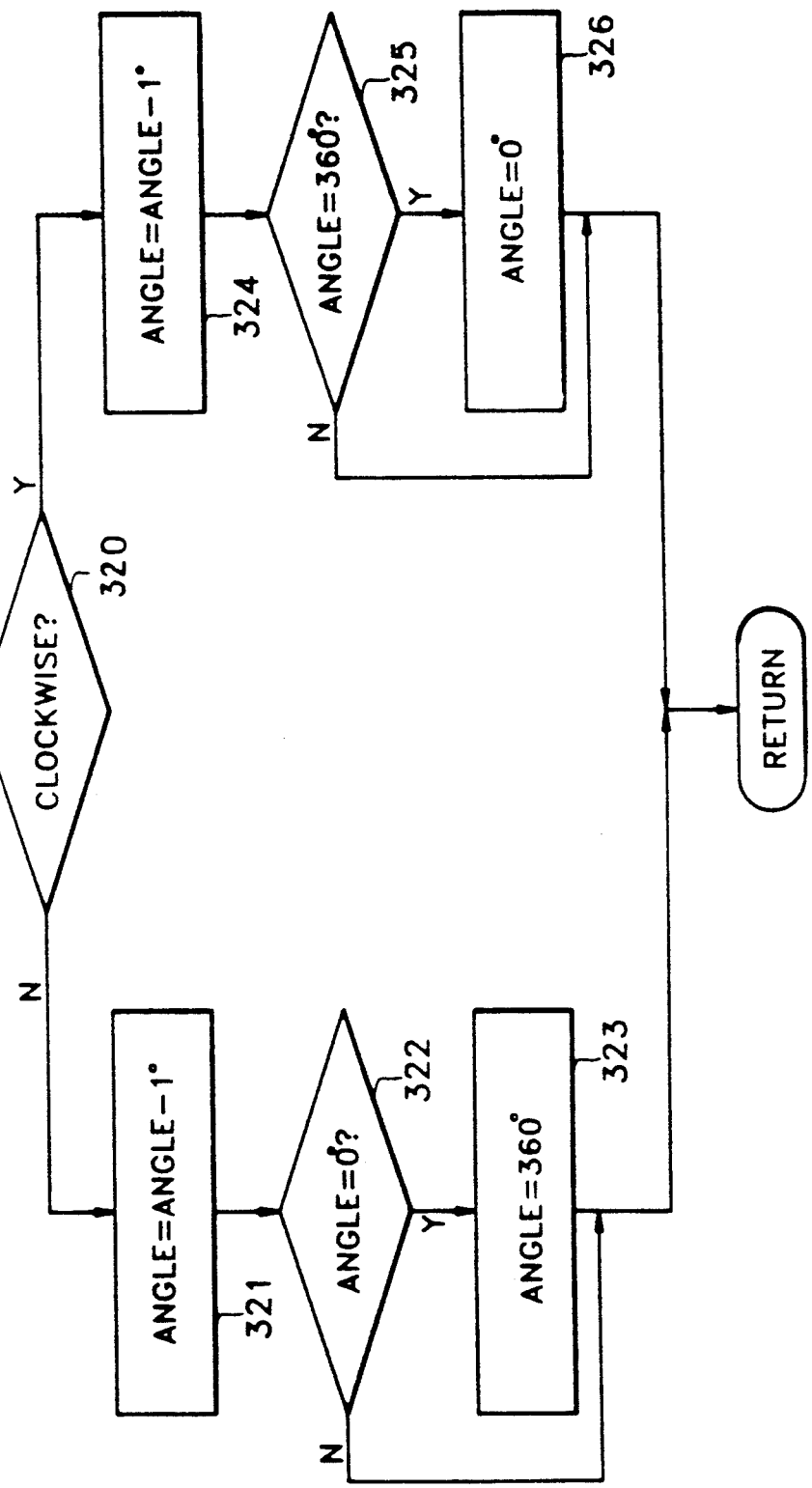

ANTENNA CONTROLLING APPARATUS AND METHOD THEREOF

BACKGROUND OF THE INVENTION

The present invention relates to an antenna controlling apparatus and a method thereof for receiving radio waves, and more particularly to an antenna controlling apparatus and a method thereof wherein the orientation of the antenna is automatically changed to point in the direction toward which the optimum conditions for receiving broadcasts are present each time a user selects a broadcasting channel.

Generally, an antenna is for transmitting and/or receiving electromagnetic wave energy via free space. Among these, a receiving antenna is used for inputting signals transmitted from a transmitting station, so as to receive broadcast information carried thereon.

Wireless broadcasts transmit radio waves carrying given information to the atmosphere to be received by a receiving antenna. During transmission, if an obstacle lies in the transmitting path, the conditions for transmission toward the direction of the obstacle become worse. As a result, the conditions for reception are impaired.

Accordingly, when the reception conditions in electronic equipment using a receiving antenna are poor, the information loaded on the radio wave is difficult to detect. In such cases, the user changes the orientation of the antenna to point in a direction where the conditions for transmission are good to obtain a good quality of the conditions for reception of radio waves.

Also, when the user changes the channel from one which currently exhibits good conditions for reception to some other channel, several parameters for the transmission and reception of the radio wave may be altered. These include the transmitter's output power, level of modulation, and orientation with respect to the receiving antenna, and the traveling distance of the radio wave to the receiving antenna as well as atmospheric conditions through which the wave travels. If the new conditions for receiving the radio wave are poor, the user has to again change the orientation of the antenna to point in a direction where the conditions for reception are best.

Therefore, for good reception when using a conventional antenna, a user must change the antenna's orientation whenever poor conditions for receiving a radio wave via the antenna exist, as is frequently the case when changing channels.

SUMMARY OF THE INVENTION

In order to overcome the aforementioned problem, an object of the present invention is to provide an antenna controlling apparatus and a method thereof which detects the conditions for reception of radio waves and automatically changes the direction of an antenna so as to obtain an optimum receiving condition.

Another object of the present invention is to provide an antenna controlling apparatus and a method thereof which changes the direction of the antenna according to an optimum receiving condition corresponding to each channel stored in memory each time a user selects a channel after storing the antenna-direction information of each channel having an optimum receiving condition, thereby performing a fine tuning.

Still another object of the present invention is to provide an antenna controlling apparatus and a method thereof which automatically changes the direction of the antenna using an automatic fine tuning (AFT) signal during selecting a channel and receives a signal in the optimum condition for receiving a signal.

In order to accomplish the above objects, the present invention provides an antenna controlling apparatus for automatically fine tuning the input broadcast signal through an antenna to precisely tune a desired channel at a tuner, which comprises:

antenna driving means for controlling the direction of the antenna to the optimum condition for receiving radio waves of the antenna according to the radio-wave receiving condition transmitted via the antenna;

means for detecting a changing degree according to the change of the antenna direction by the antenna driving means;

means for storing direction information of the antenna output from the detecting means when the direction of the antenna is in the optimum condition for receiving radio waves; and controlling means for reading out antenna position information in the optimum condition corresponding to a channel stored from the storing means during selecting a channel, and outputting information to the antenna driving means.

Also, an antenna controlling method according to the present invention comprises the steps of:

previously storing direction information of an antenna when the optimum condition for receiving radio waves is detected according to each channel;

comparing the current direction of the antenna with the optimum direction for receiving radio waves stored in the storing step when a new channel is selected; and driving the current direction of the antenna toward the optimum direction for receiving radio waves corresponding to the newly desired channel according to the value compared in the comparing step.

BRIEF DESCRIPTION OF THE DRAWINGS

Further features and advantages will become more apparent from the following and more particular description of the preferred embodiment of the invention as illustrated in the accompanying drawings in which the same reference characters generally refer to like parts throughout the views, and in which:

FIGS. 3A and 3B are operational flowcharts showing an antenna controlling method of the apparatus illustrated in FIG. 1;

FIGS. 5A and 5B are operational flowcharts showing an antenna controlling method of the apparatus illustrated in FIG. 4.

DETAILED DESCRIPTION OF THE PREFERRED EMBODIMENTS

Figure 1:
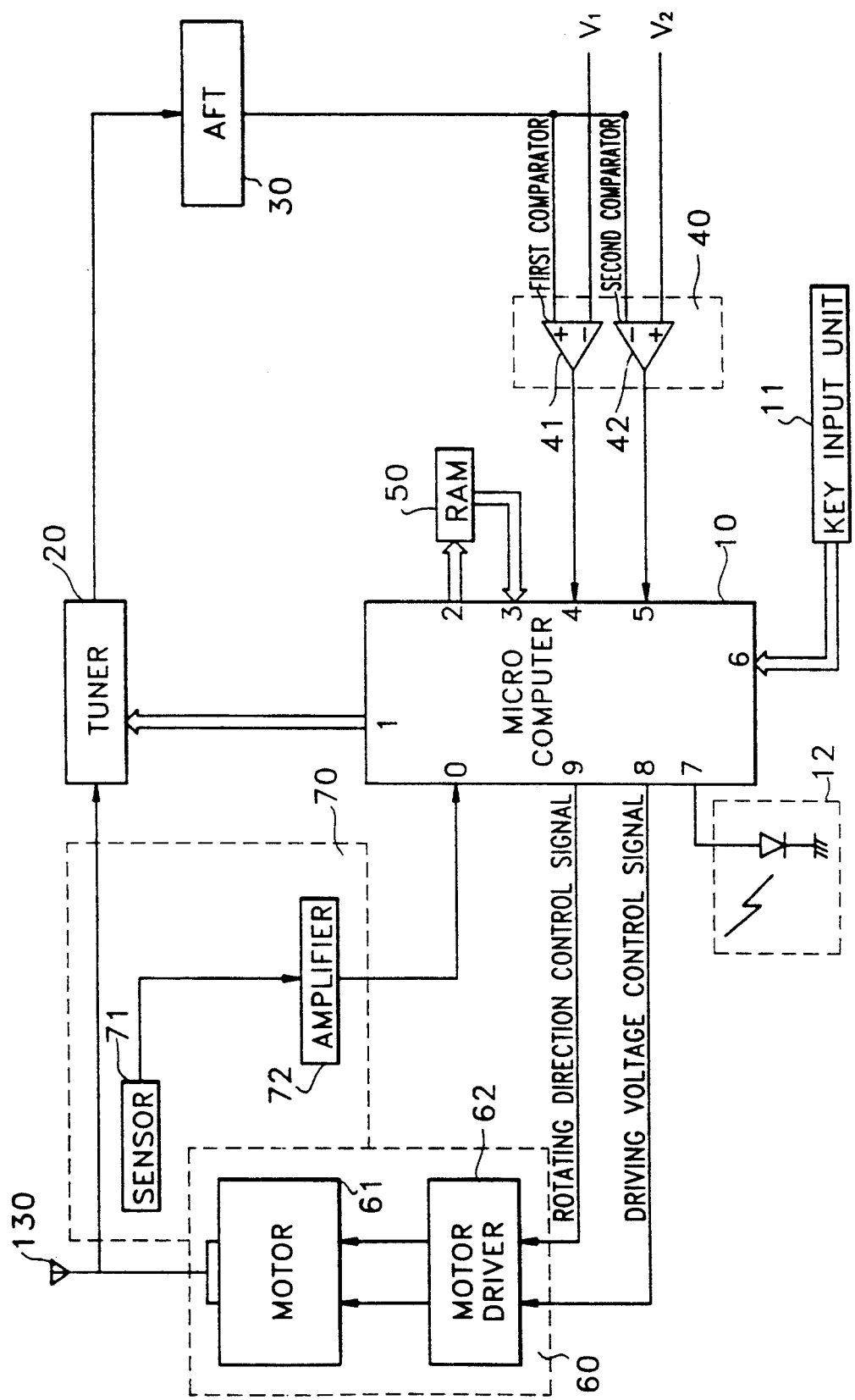
FIG. 1 is a structural diagram of an antenna controlling apparatus according to one embodiment of the present invention.

Referring to FIG. 1, an antenna controlling apparatus according to one embodiment of the present invention comprises an antenna 130 for receiving external radio waves, a detecting unit 70 for detecting the rotating angle of antenna 130 as it rotates, a key input unit 11 having a preset key and a storage key for storing data in the optimum direction of an antenna according to each channel, a displaying unit 12 consisting of a light emitting diode for displaying the preset mode when a preset command is input by key input unit 11, a tuner 20 connected to the output of antenna 130 for converting an externally transmitted radio frequency (RF) signal into an intermediate frequency (IF), an automatic fine tuning unit (AFT) 30 connected to the output of tuner 20 for automatically fine tuning the output signal of tuner 20, a determining unit 40 for inputting the output signal of AFT 30 and determining the tuning condition of tuner 20, a storing unit 50 constituted by a RAM for writing the rotating angle value of the antenna detected by detecting unit 70, an antenna driving unit 60 for rotating antenna 130 to point in a direction where the condition for reception of radio waves is best, and a microcomputer 10 for controlling the system.

The comparing unit 40 comprises a first comparator 41 for receiving the output signal of AFT 30 via a non-inverting terminal while receiving a reference voltage (hereinafter referred to as a threshold voltage) V1 via an inverting terminal, to compare the two, and a second comparator 42 for receiving the output signal of AFT 30 via an inverting terminal while receiving a threshold voltage V2 via a non-inverting terminal, to compare the two.

Antenna driving unit 60 comprises a motor 61 for rotating antenna 130, and a motor driver 62 for driving motor 61 according to a driving voltage control signal and a rotating direction control signal both of which are output from microcomputer 10.

Detecting unit 70 comprises a sensor 71 for detecting the rotating angle of motor 61, and an amplifier 72 for amplifying the output signal of sensor 71.

Figure 2:
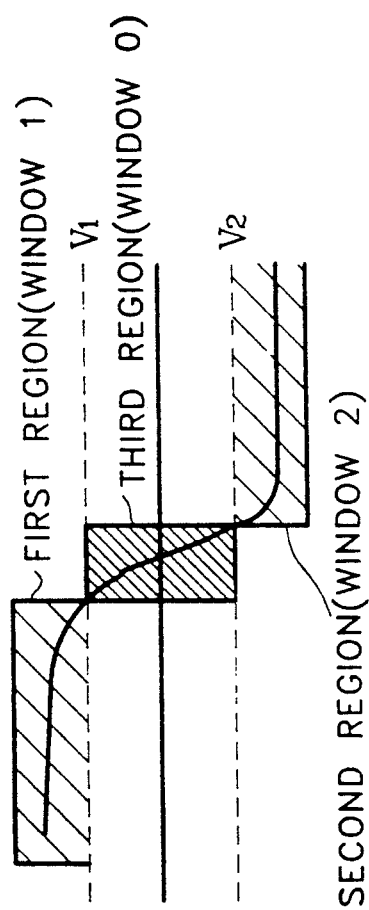
FIG. 2 is a waveform diagram showing the output of the AFT unit shown in FIGS. 1 and 4.

FIG. 2 is a waveform diagram showing voltage characteristics of the output of AFT 30 shown in FIG. 1 (and FIG. 4 as described later).

One embodiment of the present invention will be hereinbelow explained with reference to FIGS. 1 and 2.

First, an RF signal transmitted to the atmosphere from a radio-wave transmitting station (broadcasting station) is received via antenna 130. The RF signal received via receiving antenna 130 is input to tuner 20 constituted by a coil and capacitance so as to be tuned to one frequency, to be converted into an IF signal. The IF signal output via tuner 20 is input to AFT 30 which produces an AFT signal for automatic fine tuning.

Given that the threshold voltages for defining the AFT range are V1 and V2, when the output voltage of AFT 30 is higher than first threshold voltage V1, first comparator 41 outputs a "high" to a control input port 4 of microcomputer 10. Accordingly, microcomputer 10 sets a precise tuning voltage to be supplied to tuner 20 via a control output port 1. On the other hand, if the output voltage of AFT 30 is lower than a second threshold voltage V2, then, second comparator 42 outputs a "high" to a control input port 5 of microcomputer 10. In this case, a precise tuning voltage is set using the above-mentioned method.

In other words, when selecting a predetermined channel, microcomputer 10 checks control input ports 4 and 5 to determine whether the AFT signal is within a predetermined range (i.e., between V1 and V2). If the outputs of first and second comparators 41 and 42 are both "low," meaning that the AFT voltage is within the range established by threshold voltages V1 and V2, microcomputer 10 outputs a control signal for controlling the tuning voltage to tuner 20 via control output port 1.

Meanwhile, via key input unit 11, a user inputs key data according to the antenna preset key to a control input port 6 of microcomputer 10, in order to store the optimum rotating angle of antenna 130 into RAM 50. When antenna preset key data is input to microcomputer 10, the microcomputer outputs a control signal via a control port 7, which operates displaying unit 12 consisting of a light emitting diode.

In a preset mode, a user selects an antenna rotating angle for each channel corresponding to the optimum condition for receiving radio waves, and then stores this data into RAM 50, by means of a storage key input via key input unit 11. That is, for each channel, when the outputs of first and second comparators 41 and 42 are both low, the antenna's angle of rotation detected in detecting unit 70 in accordance with the storage key input mounted on key input unit 11, is stored in RAM 50.

Meanwhile, a user supplies channel-selection data such as channel-up or channel-down key data into control input port 6 of microcomputer 10 via key input unit 11 in order to change the currently received channel into a desired channel. Upon receiving the channel-selection data, microcomputer 10 outputs the control signal via its control output port 1 in order to select the channel to be turned by tuner 20. At the same time, microcomputer 10 reads out the orientation angle for antenna 130 corresponding to the new channel from RAM 50 which stores the antenna rotation angle having the optimum conditions for reception.

Then, microcomputer 10 compares the stored angle with the current angle of antenna 130 input via sensor 71, and determines the rotating direction of motor 61. Successively, microcomputer 10 outputs a motor driving voltage control signal via a control port 8 and outputs a rotating direction control signal via control output port 9, thereby rotating motor 61.

As motor 61 rotates, sensor 71 forming a rotating plate (not shown) on motor 61, generates a sensor signal having a rectangular waveform. The signal output from sensor 71 is amplified in amplifier 72, and input to control input port 0 of microcomputer 10. The sensor 71 is divided into a light-emitting portion which emits a light to the rotating plate, and a light-receiving portion which detects a light signal from the rotating plate to generate the sensor signal.

Microcomputer 10 receives the output signal from amplifier 72 and determines whether the antenna is rotated by the proper angle corresponding to the optimum condition for reception of the radio waves of the channel stored in RAM 50, to thereby rotate motor 61 by the angle stored in RAM 50.

Figure 3A:
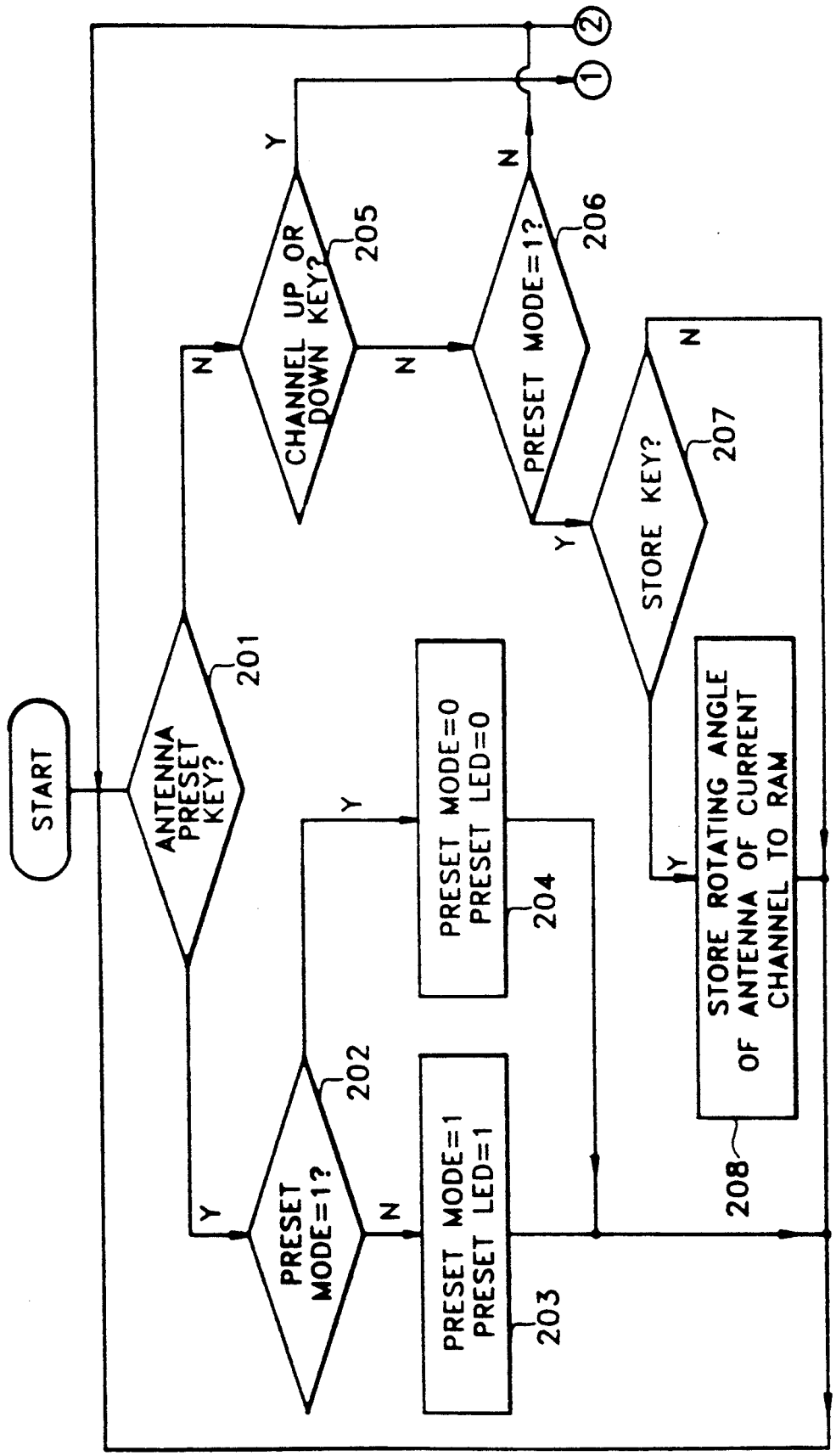

FIGS. 3A and 3B are operational flowcharts showing the antenna controlling method of the apparatus illustrated in FIG. 1. A storing operation is from step 201 to step 208, a comparing operation is from step 209 to step 210, a driving operation is from step 211 to step 213, and a calculation operation is from step 214 to step 220. Hereinbelow, the operation of one embodiment of an antenna controlling apparatus for performing the present invention will be described in reference to FIGS. 1, 2, 3A and 3B.

First of all, microcomputer 10 determines whether or not antenna preset key data is input via key input unit 11 playing the role of a toggle key (step 201).

When antenna preset key data is input via key input unit 11, it is determined whether the current mode of microcomputer 10 is a preset mode (step 202).

If the current mode is not a preset mode, microcomputer 10 establishes a preset mode by the antenna preset key data being input via key input unit 11. As microcomputer 10 is converted into a preset mode, microcomputer 10 operates displaying unit 12 consisting of a light emitting diode via control port 7 (step 203).

If the current mode is a preset mode, the preset mode is released by the preset key input via key input unit 11, and accordingly, the operation of displaying unit 12 is stopped via control port 7 (step 204).

If the antenna preset key is not input via key input unit 11 in step 201, microcomputer 10 determines whether channel-selection data is input via key input unit 11 (step 205).

If the channel-selection data is not input via key input unit 11, microcomputer 10 determines whether the current mode is a preset mode (step 206). Then, if the current mode is a preset mode in this case, microcomputer 10 determines whether a storage key is input via key input unit 11 (step 207).

In step 207, when the storage key is input via key input unit 11, microcomputer 10 receives from sensor 71 a sensor signal generated while antenna 130 rotates, and stores into RAM 50 the current angle of antenna 130 as the optimum condition for reception (step 208). Here, the output of first and second comparators 41 and 42 are both low, and the rotating angle of antenna 130 detected by detecting unit 70 according to the storage key input is stored in RAM 50.

When channel-selection data is input in step 205, microcomputer 10 changes the channel accordingly, recognizes the current angle of antenna 130 by means of a sensor signal generated via sensor 71, reads out the antenna angle for the optimum condition for receiving the radio waves of the new channel, which is stored in RAM 50, and then subtracts the stored angle from the currently recognized antenna angle (during rotation), to determine whether the obtained value is positive (step 209). If the value obtained as above in step 209 is not positive, microcomputer 10 determines whether it is negative (step 210).

If the obtained value is positive in step 209, microcomputer 10 outputs a motor driver control signal and a rotation direction control signal F/$\overline{R}$ to a motor driver 62 via control output ports 8 and 9, to thereby reversely rotate motor 61 (step 211). On the other hand, if the obtained value is negative, microcomputer 10 outputs the motor driver control signal and a logic high rotating direction control signal F/$\overline{R}$ to motor driver 62, to thereby forwardly rotate the motor (step 212).

If, in step 210, the value obtained by subtracting the angle stored in RAM 50 from the currently recognized angle of antenna 130 is not negative (i.e., the value equals zero), microcomputer 10 does not output a motor driver control signal and a rotating direction control signal via control output ports 8 and 9 to motor driver 62 (step 213).

Meanwhile, as motor 61 rotates, sensor 71 continuously generates a sensor signal. Microcomputer 10 detects the rising edge of the sensor signal from sensor 71 to perform an interrupt. That is, as antenna 130 rotates, microcomputer 10 detects when the angle of rotation is positive with respect to the stored angle from RAM 50 (step 214).

If the above angle of rotation of antenna 130 is not positive, microcomputer 10 subtracts 1° from the currently recognized angle. By carrying out the equation "current angle=current angle−1°," it is determined when the current angle reaches 0° (steps 215 and 216). When the current angle reaches 0°, it is reset to 360° and the program returns (step 217).

If the currently recognized angle of rotation of antenna 130 is positive at the time of the interrupt being generated, microcomputer 10 adds 1° to the current angle, according to the equation "current angle=current angle+1°," to determine when the current angle reaches 360° (steps 218 and 219). If the current angle of antenna 130 does reach 360°, microcomputer 10 resets the current angle to 0° and the program returns (step 220).

Figure 4:
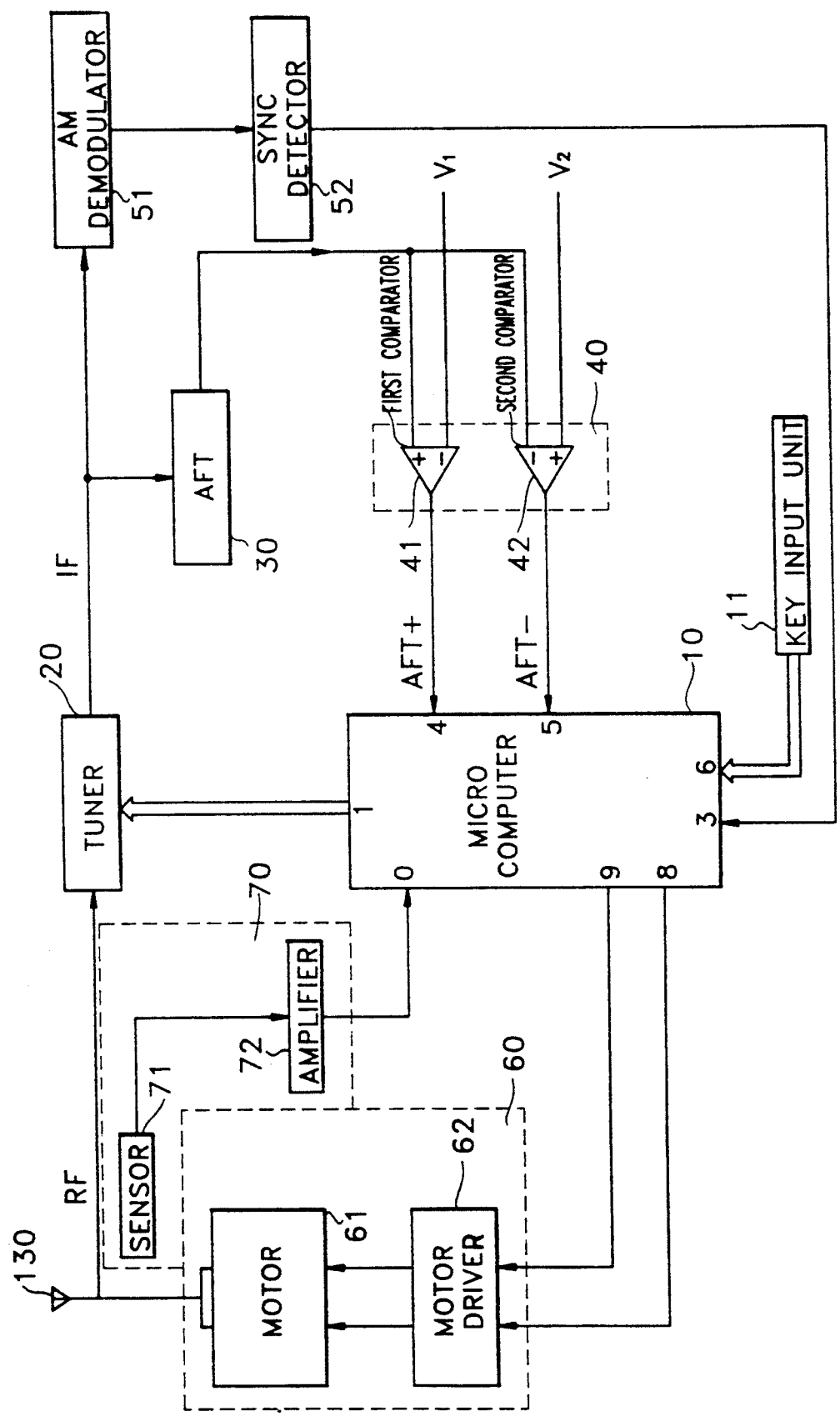
FIG. 4 is a structural diagram of an antenna controlling apparatus according to another embodiment of the present invention.

FIG. 4 is a structural diagram of an antenna controlling apparatus according to a second embodiment of the present invention.

Referring to FIG. 4, those elements having the same structures as those of FIG. 1 have the same reference characters. The difference between the FIG. 1 and FIG. 4 embodiments is that instead of RAM 50, (FIG. 1) the antenna controlling apparatus of this FIG. 4 embodiment includes an AM demodulator 51 for receiving and AM-demodulating the output of tuner 20, and a sync detector 52 for detecting a sync signal loaded on the video signal output from AM demodulator 51 to be input to control input port 3 of microcomputer 10.

Figure 5A:
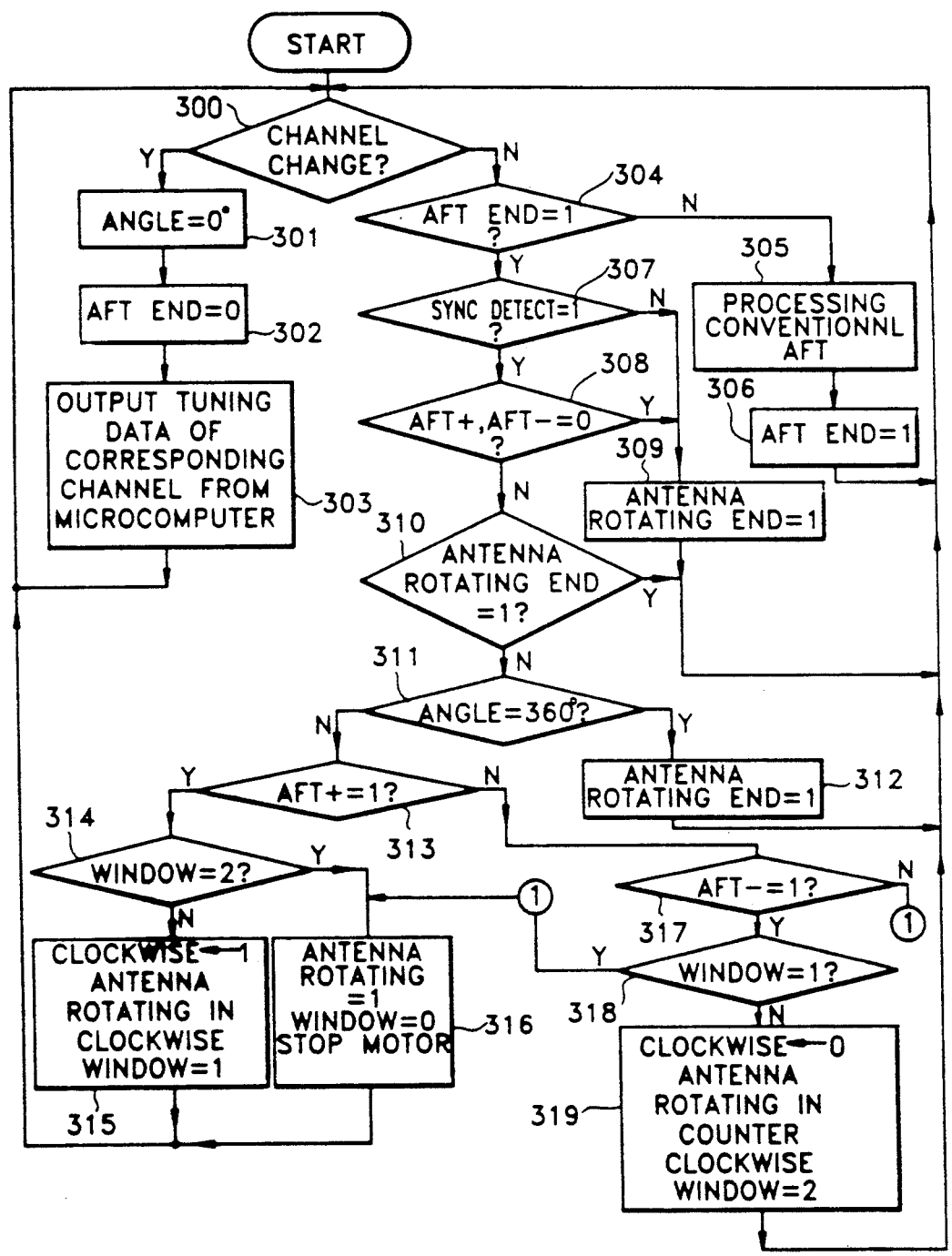

FIGS. 5A and 5B are flowcharts of the method of the antenna controlling apparatus illustrated in FIG. 4.

Referring to FIGS. 5A and 5B, an AFT process is from steps 301 to 307, an AFT determining process is step 308, an antenna driving process is from steps 309 to 319, and a calculation process is from steps 320 to 326. Hereinbelow, a method for controlling an antenna according to the second embodiment of the present invention will be explained with reference to FIGS. 2, 4, 5A, and 5B.

First, as channel-selection data is input via key input unit 11, it is determined whether a radio-wave receiving channel is changed (step 300). When the channel-selection data is input, microcomputer 10 initializes the rotating angle of antenna 130 to 0° (step 301), and operates AFT unit 30 to perform the AFT operation (step 302). Then, via its control output port 1, microcomputer 10 outputs to tuner 20 a tuning control signal corresponding to the channel selected by channel-selection data input through key input unit 11 (step 303).

If the channel is not changed (i.e., the channel-selection data is not received from key input unit 11,) it is determined whether the operation of AFT unit 30 is completed (step 304). If the operation of AFT unit 30 is not completed, a conventional AFT operation is carried out which automatically sets the local oscillating (LO) frequency optimally (step 305). Thereafter, AFT operation is completed (step 306). The, AFT operation is completed when a control signal is output to tuner 20.

Then, control input port 3 of microcomputer 10 receives a signal from sync detector 52, indicating the presence of a sync signal loaded on the video signal output from AM demodulator 51, to thereby determine the input of a video signal (step 307). As the sync signal is detected in sync detecting unit 52, microcomputer 130 outputs a control signal to the tuner 20. At this time, microcomputer 130 receives the AFT correction signal output from comparing unit 40, to determine whether the video signal is in the optimum receiving condition (step 308).

The above operation will be explained in detail in reference to Table 1 and FIG. 2.

When the AFT output signal from AFT unit 30 is less than threshold voltage V1 and greater than threshold voltage V2, the AFT output signal falls within the third region, and is said to be optimal. With the AFT signal in the third region, the outputs of first and second comparators 41 and 42 are both low.

TABLE 1

|  | 1st region | 2nd region | 3rd region |
|---|---|---|---|
| first comparator output (AFT +) | 1 | 0 | 0 |
| second comparator output (AFT −) | 0 | 1 | 0 |

If the AFT output signal is greater than threshold voltage V1, it falls in the first region of FIG. 2, so that first comparator 41 outputs a "high" and second comparator 42 outputs a "low." On the other hand, as can be seen in Table 1, if the AFT output signal is less than threshold voltage V2, it falls in the second region, so that the output of first comparator 41 is low and that of second comparator 42 is high.

When the outputs of first and second comparators 41 and 42 are both low, meaning that the optimum condition for receiving has been met in step 308, microcomputer 10 outputs a motor driver control signal via output ports 8 and 9 to stop the rotation of antenna 130 or maintain its current orientation (step 309).

In step 308, the rotation of antenna 130 continues until the optimum condition for video reception is reached (i.e., when both outputs of comparing unit 40 are low). At this time, it is determined that antenna rotation ends (step 310). As antenna rotation is being carried out, microcomputer 10 receives the antenna rotating angle signal output via sensor 71, to determine whether the current angle of the antenna has reached 360° (step 311), which means that antenna 130 has made one full revolution. If the current angle of antenna 130 has reached 360°, microcomputer 10 supplies the necessary control signals to motor driving unit 60 via control output ports 8 and 9 to stop rotating the antenna (step 312).

While the rotating angle signal of antenna 130 output via sensor 71 is received by microcomputer 10, and if the current angle of antenna 130 is not yet 360°, it is determined whether the output of AFT 30 falls in the first region of FIG. 2, meaning that the output of first comparator 41 is high and the output of second comparator 42 is low (step 313). If the AFT output does fall within the first region, microcomputer 10 determines whether the AFT output signal is in the window 2 condition illustrated in Table 2 (step 314).

TABLE 2

|  | window 0 | window 1 | window 2 |
|---|---|---|---|
| first comparator output (AFT +) | 0 | 1 | 0 |
| second comparator output (AFT −) | 0 | 0 | 1 |

If the AFT output signal is not in window 2, it is determined that the AFT signal exists in the first region, so that microcomputer 10 supplies control signals to motor driving unit 60 via control output ports 8 and 9, and rotates antenna 130 clockwise (step 315).

When the AFT output signal swings from window 1 to window 2, microcomputer 10 recognizes that the AFT output signal exists in window 0, which is the optimum condition for receiving radio waves, so that microcomputer 10 supplies a control signal output to motor driving unit 60 via control output ports 8 and 9 to stop rotating antenna 130 (step 316). That is, while the antenna rotates in the clockwise direction from window 1, if the AFT output signal reaches window 2, the antenna rotation is stopped. This state is a state of window 0 where the antenna is in the optimum position for receiving radio waves.

If the output of AFT 30 is not in the first region, microcomputer 10 determines whether the AFT output signal exists in the second region, and if it is not present in the second region, the microcomputer recognizes the AFT output to be in the third region. Here, microcomputer 10 supplies the control signals to motor driving unit 60 via control output ports 8 and 9, which stops the rotation of antenna 130. If the AFT signal does exist in the second region, microcomputer 10 determines whether the AFT output signal swings from window 2 to window 1, that is, whether the AFT output signal exists in the first region (step 318).

If the AFT output signal is not in window 1, AFT output signal exists in window 2. Here, microcomputer 10 supplies a control signal to motor driving unit 60 via control output ports 8 and 9, and rotates antenna 130 counter-clockwise (step 319).

Immediately after the AFT output signal swings from window 2 to window 1 during step 318, step 316 is carried out. That is, microcomputer 10 recognizes that the AFT output signal exists in a state of window 0 being the optimum condition for receiving radio waves, and supplies control signals to motor driving unit 62 via control output ports 8 and 9, which stops the rotation of antenna 130. That is, while the antenna rotates in the counter clockwise direction from window 2, if the AFT output signal reaches window 1, the antenna rotation is stopped. This state is a state of window 0 where the antenna is in the optimum position for receiving radio waves.

Meanwhile, as motor 61 rotates, sensor 71 generates a sensor signal, and microcomputer 10 performs the calculation process (steps 320-326) in FIG. 5B as the sensor signal is input through amplifier 71.

Specifically, as antenna 130 rotates, microcomputer 10 detects whether its rotating direction is positive (step 320). If the rotating direction of antenna 130 is not positive, microcomputer 10 subtracts 1° from the current angle, to determine when the current angle reaches 0° by repeatedly carrying out the equation "current angle=current angle−1°" (steps 321 and 322). When the current angle reaches 0°, the current angle is reset to 360° (step 323).

If, in step 320, the rotating direction of the antenna is positive, microcomputer 10 adds 1° to the current angle, to determine when the current angle reaches 360° by repeatedly carrying out the equation "current angle=current angle+1°" (steps 324 and 325). When the current angle of antenna 130 reaches 360°, microcomputer 10 resets the current angle of antenna 130 to 0° (step 326).

As described above, the present invention changes the orientation of an antenna to point in the direction such that optimum conditions for receiving radio waves are present. The user does not manually change the antenna's orientation, and reception conditions are automatically set so as to be optimal whenever a channel is changed.

What is claimed is:

1. An antenna controlling apparatus for automatically fine tuning a broadcasting signal received through an antenna to precisely tune a desired channel, said apparatus comprising:

antenna driving means for controlling the direction of the antenna to an optimum condition, as compared to a plurality of other conditions, for receiving radio waves for the desired channel;

means for detecting a changing degree according to a change of direction of the antenna by said antenna driving means;

means for storing direction information of the antenna according to an output from said detecting means when the direction of the antenna is in the optimum condition for receiving radio waves for the desired channel;

controlling means for reading out from said storing means antenna direction information in the optimum condition during selection of the desired channel, and outputting the antenna direction information to said antenna driving means;

a tuner for converting a high frequency signal of a broadcasting signal received via the antenna to an intermediate frequency signal;

AFT means for automatically fine tuning an output signal of said tuner;

comparing means for receiving an output signal of said AFT means and detecting a tuning condition;

key input means having a preset key and a storage key for assigning and inputting a rotating angle of an antenna output via the detecting means so as to be stored in said storing means when the direction of the antenna is in the optimum condition for receiving radio waves; and displaying means for displaying a preset mode when said preset key is pressed via said key input means;

wherein said storing means comprises a semiconductor memory for storing the rotating angle of the antenna when said comparing means indicates that the output of said AFT means is within first and second predetermined threshold voltages.

2. The antenna controlling apparatus as claimed in claim 1, wherein said detecting means comprises:

a sensor for detecting a rotating angle of the antenna as the antenna rotates; and an amplifier for amplifying the signal output, said control means being coupled to receive the amplified signal.

3. An antenna controlling method comprising the steps of:

automatic fine tuning to convert a condition for receiving radio waves received at an antenna during changing of a channel to an optimum receiving condition, as compared to a plurality of other conditions, for the changed channel;

determining whether the automatic fine tuned condition is the optimum condition; and driving an antenna to change the direction of the antenna to the optimum condition unless it is determined that the automatic fine tuned condition is the optimum condition;

wherein said automatic fine tuning step includes the sub-steps of:

determining whether a channel has been changed by a key input;

setting the rotating angle of an antenna to 0° when a present channel is changed during said channel-change determining step;

performing automatic fine tuning (AFT);

stopping said automatic fine tuning when the antenna is rotated once during said AFT step or when said AFT step is completed; and if said stopping step is not performed, then detecting a sync signal provided on a video signal received by the antenna;

and wherein said channel-change determining step determines whether an AFT range during said AFT step is within predetermined first and second threshold ranges when the sync signal is detected during said detecting step.

4. The antenna controlling method as claimed in claim 3, wherein said antenna driving step comprises the steps of:

a first determining step of determining whether the antenna rotates once, said first determining step not being performed if the AFT range is within the threshold range during said AFT range determining step;

a second determining step of determining whether the AFT range is within the preset threshold range, said second determining step not being performed if the antenna rotates once during said antenna rotation determining step;

rotating the antenna so as to be in the optimum condition so that the AFT range is within the threshold range during said AFT range state determining step;

determining a variation in the first position as the antenna position changes; and stopping the rotation of the antenna if the antenna is in the optimum condition.

5. The antenna controlling method as claimed in claim 4, further comprising the steps of:

determining a rotating direction of the antenna as the antenna rotates;

positively driving the antenna by adding a predetermined angle to the current angle of the antenna if the antenna rotates positively during said antenna-direction determining step, and resetting the current angle to 0° when the current angle of the antenna is 360°; and negatively driving the antenna by subtracting a predetermined angle from the current angle of the antenna if the antenna rotates negatively during said antenna-direction determining step, and resetting the current angle of the antenna to 360° when the current angle of the antenna is 0°.

* * * * *